United States Patent [19]
Cord et al.

[11] Patent Number: 5,970,213
[45] Date of Patent: Oct. 19, 1999

[54] APPARATUS FOR HEATING A TRANSPARENT SUBSTRATE UTILIZING AN INCANDESCENT LAMP AND A HEATING DISK EMITTING INFRARED WAVELENGTHS

[75] Inventors: Bernhard Cord, Alzenau; Karl-Heinz Schuller, Obertshausen; Jaroslav Zejda, Rodenbach, all of Germany

[73] Assignee: Balzers und Leybold Deutschland Holding Aktiengesellscaft, Hanau, Germany

[21] Appl. No.: 08/204,728

[22] Filed: Mar. 1, 1994

[30] Foreign Application Priority Data

Mar. 2, 1993 [DE] Germany .............................. 43 06 398

[51] Int. Cl.$^6$ .............................. H05B 6/00; F27D 11/00
[52] U.S. Cl. .......................... 392/416; 219/390; 373/112; 118/725
[58] Field of Search .................... 392/416, 418, 392/408, 420, 411, 407; 250/495.1, 504 R; 118/724, 725, 50.1; 437/248, 247; 427/542, 557, 585; 219/390, 405, 411; 373/112

[56] References Cited

U.S. PATENT DOCUMENTS

| | | |
|---|---|---|
| 4,081,313 | 3/1978 | McNeilly et al. ........................ 156/610 |
| 4,581,520 | 4/1986 | Vu et al. ................................... 219/405 |
| 4,654,509 | 3/1987 | Robinson et al. ....................... 219/405 |
| 5,047,611 | 9/1991 | Stultz ....................................... 219/405 |
| 5,245,158 | 9/1993 | Hashizume et al. .................... 392/416 |

FOREIGN PATENT DOCUMENTS

| | | | |
|---|---|---|---|
| 4114039 | 11/1991 | Germany . | |
| 60-3124 | 1/1985 | Japan . | |
| 60-236216 | 11/1985 | Japan . | |
| 60-239398 | 11/1985 | Japan . | |
| 62-94925 | 5/1987 | Japan ..................................... | 392/416 |
| 63-257221 | 10/1988 | Japan ..................................... | 392/418 |
| 1-110726 | 4/1989 | Japan . | |
| 1-309286 | 12/1989 | Japan ..................................... | 392/416 |
| 5-10677 | 1/1993 | Japan . | |
| 1571796 | 6/1990 | U.S.S.R. . | |

OTHER PUBLICATIONS

Van Winkle, H.E., "One–Way Radiant Heat Transfer", IBM Tech. Disclosure Bulletin, vol. 18, No. 4, Sep. 1975.

*Primary Examiner*—John A. Jeffery
*Attorney, Agent, or Firm*—Fulbright & Jaworski, LLP.

[57] ABSTRACT

A heating disk is located inside a vacuum chamber between a substrate holder inside the chamber and a lamp outside the chamber. The lamp emits radiation in a wavelength range which passes through a glass plate in the chamber wall but is absorbed by the heating disk, which may consist of graphite. When the disk is heated to 1000° K. it emits radiation in a wavelength range which can be absorbed by a transparent substrate in the holder.

15 Claims, 2 Drawing Sheets

APPARATUS FOR HEATING A TRANSPARENT SUBSTRATE UTILIZING AN INCANDESCENT LAMP AND A HEATING DISK EMITTING INFRARED WAVELENGTHS

BACKGROUND OF THE INVENTION

The invention relates to an apparatus for heating a substrate disposed on a substrate holder in a chamber behind a glass plate by the radiation from a lamp disposed outside of the chamber behind the glass plate.

An apparatus of this kind is described for example in U.S. Pat. No. 5,047,611. With it a transparent insulating coating on an integrated circuit is said to be hardened from the inside out because the light first heats the conductor plate and the heat then flows outward from it through the insulating coating. The lamp in this apparatus is disposed at the focal point of a parabolic mirror, so that a parallel beam passes from the lamp through the glass plate to the substrate. In ordinary incandescent lamps the temperature of incandescence of the filament is more than 2000° K. The maximum light emission then has a wavelength of about 1.1 to 1.4 $\mu$m. Such short-wavelength light is hardly absorbed by the glass plate, so that the light is able to arrive at the substrate with minor absorption losses.

If transparent substrates instead of opaque substrates are to be warmed in a chamber by externally disposed light sources, it is then necessary to select the wavelength of the radiation so as to obtain maximum absorption of the radiation by the substrate. If, for example, the substrate absorbs at longer wavelengths, the temperature of incandescence of the lamp can be lowered, thereby resulting in a shift of the peak emission toward greater wavelengths. This lowering of the incandescence temperature, however, is bound up with a great decrease of the emission, so that the desired effect of raising the warming rate of the substrate is not achieved. In addition, the shift toward greater wavelengths results in the long-wavelength light also being absorbed to a great extent in the glass plate defining the chamber, so that a greater heat loss occurs at that point. Consequently, in high-vacuum coating apparatus in which transparent substrates are to be coated, the lamps appropriate for this purpose are disposed inside of the vacuum chamber, thereby undesirably increasing the volume of the vacuum chamber.

The problem on which the invention is based is to construct an apparatus of the kind described above such that both opaque and transparent substrates can be warmed therein with the lowest possible energy demand by a lamp disposed externally behind a glass plate.

SUMMARY OF THE INVENTION

This problem is solved in accordance with the invention by providing within the chamber, between the glass plate and the substrate holder, a holder bearing a heating disk made of a material having a high absorption in the wavelength range of the radiation emitted by the lamp, and with a high spectral emittance.

Such an apparatus makes it possible when warming a transparent substrate to convert the short-wavelength light into longwavelength light by means of the heating plate then inserted in front of it, since the heating plate absorbs the short-wavelength light, becomes warm, and emits long-wavelength light. If, for example, the tungsten filament of the lamp has a temperature of 2000° K. and emits light of 1.1 to 1.3 $\mu$m, the heating plate must then be so arranged and designed that it warms up to about 1000° K. in order to emit sufficiently long-wavelength light for heating the substrate that is transparent at 1.1 $\mu$m.

If it is desired to use the apparatus according to the invention to heat substrates having maximum absorption at short wavelengths (less than 1.1 $\mu$m), for example wafers of aluminum or silicon which are then to be coated as solid plates, then the heating plate can simply be removed and the substrate can be heated directly by the short-wavelength light.

An especially high degree of spectral emission is obtained if the heating disk is made of Inconel, which is the trademark for a corrosion resisting alloy containing 76% Ni, 15% Cr, and 9% Fe.

Costs are lower if the heating disk consists of graphite.

Another especially advantageous improvement of the invention consists in designing the lamp to emit focused light, and locating the focal point of the focused light close to the glass plate of the chamber. In such an embodiment, the area of the glass plate through which the light enters the chamber is especially small. In this way the window formed in the chamber by the glass plate can be correspondingly small. The small size of the window makes it possible to provide a glass plate of small thickness, even in spite of great pressure differences between the interior of the chamber and the exterior. The result is low absorption of the light in the glass plate, which in turn reduces the heat losses.

The focused light is advantageous especially for heating substrates for magnetic solid plates, because the latter have a hole in the center where the focused lamp light has a lower intensity of radiation. Also, with focused light the light source can be adapted to different substrate diameters simply by varying the distance between the lamp and the substrate.

The light of the lamp could be focused by means of a condenser lens, for example. The available lamp light, however, will be focused with especially little loss and aimed at the substrate if the lamp has its filament at the focal point of an elliptical reflector.

For heating solid plates which are to be coated simultaneously on both sides it is advantageous if, according to another further development of the invention, a holder is provided on both sides of the substrate holder for a heating disk, a glass plate defining the chamber, and, behind it, a lamp.

The heating disk can be kept at a stable temperature if a temperature sensor is disposed on each heating disk, which communicates with a power supply of the lamp through a controller.

Since the heating disks emit radiation from both sides, the glass plate or plates are also heated. This heating can be reduced if, according to another further development of the invention, a reflector is disposed between each glass plate and heating disk, and has a central opening for the radiation from the respective lamp. Since these radiation reflectors are disposed at least near to the outer focal point of the respective lamp they need to have only a small opening, thereby achieving a maximum reflective action without interfering with the light coming from the lamp.

BRIEF DESCRIPTION OF THE DRAWINGS

The invention admits of numerous embodiments. For the further explanation of its basic principle two embodiments are represented diagrammatically in the drawing, wherein.

DETAILED DESCRIPTION OF THE PREFERRED EMBODIMENTS

Figure 1:
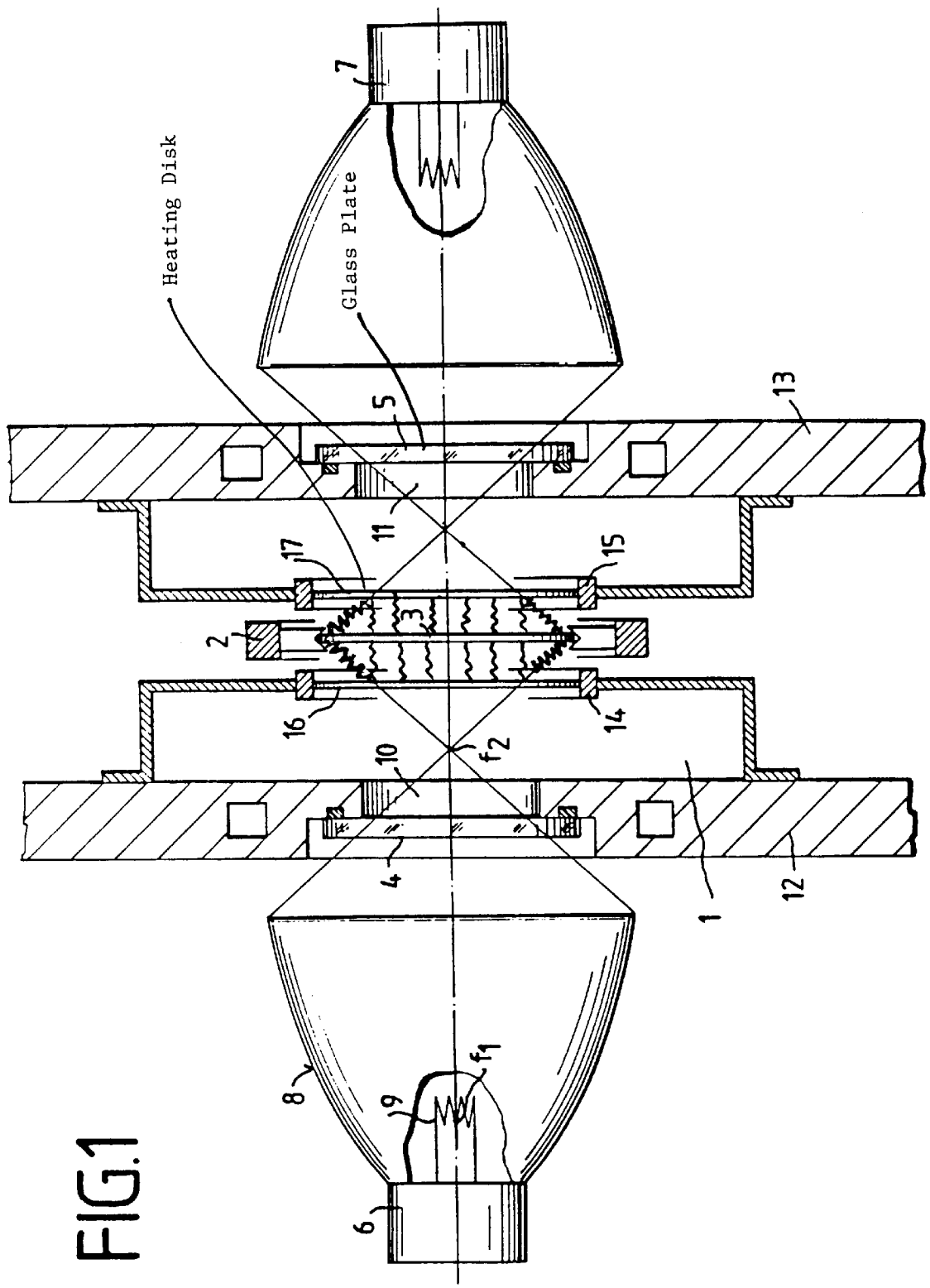
FIG. 1 is a section through a part of a high-vacuum coating apparatus configured according to the invention.

FIG. 1 shows a chamber 1 in which a substrate holder 2 holds a circular substrate 3. The substrate 3 is to be a glass disk which after it is coated will form a magnetic solid plate. The chamber 1 serves for warming the substrate 3. Then the substrate 3 is transported into other chambers, not shown, and there it is coated.

The chamber 1 is sealed off from the atmosphere on each side by glass plates 4 and 5. In back of each glass plate 4, 5, there is a lamp 6, 7, which radiates focused light to heat the substrate 3. Each of the lamps 6 and 7 has an elliptical reflector 8. The latter is of such a size that the filament 9 is in the first focal point $f_1$ of the reflector 8. The second focal point $f_2$ is in the area of the glass plates 4 and 5; in this embodiment it is between the substrate 3 and the glass plate 4 and 5 within the chamber 1. Thus a relatively small window 10, 11, in a lateral wall 12, 13, of chamber 1 will suffice for the admission of the light. Consequently the glass plates 4 and 5 need to have only a relatively slight thickness, so that hardly any light is absorbed in them.

The filaments 9 can be conventional tungsten filaments. At the usual operating temperatures of such filaments 9 of over 2000° K., the maximum of the emission is about 1.1 to 1.4 $\mu$m. Light of this wavelength is hardly at all absorbed by glass, which is favorable to the passage of light through the glass plates 4 and 5, and provides for the heating of substrates 3 of aluminum or silicon within the chamber 1 in an optimum manner. However, if substrates 3 of glass are to be heated, then with such shortwavelength light this is largely prevented. Therefore, in front of each side of the substrate 3 the chamber has a holder 14, 15, into which a respective heating disk 16, 17, is replaceably inserted. Each heating disk 16, 17, consists of a material which effectively absorbs the radiation of the lamps 6 and 7 and has a high emittance, preferably graphite or Inconel. They warm up to about 1000° K. and then emit light with a wavelength above 2.5 $\mu$m. The heating disks 16 and 17 thus convert the short wave-length light to long-wavelength light.

If within chamber 1 substrates of non-transparent material such as aluminum are to be heated, then these heating disks 16 and 17 are removed.

Figure 2:
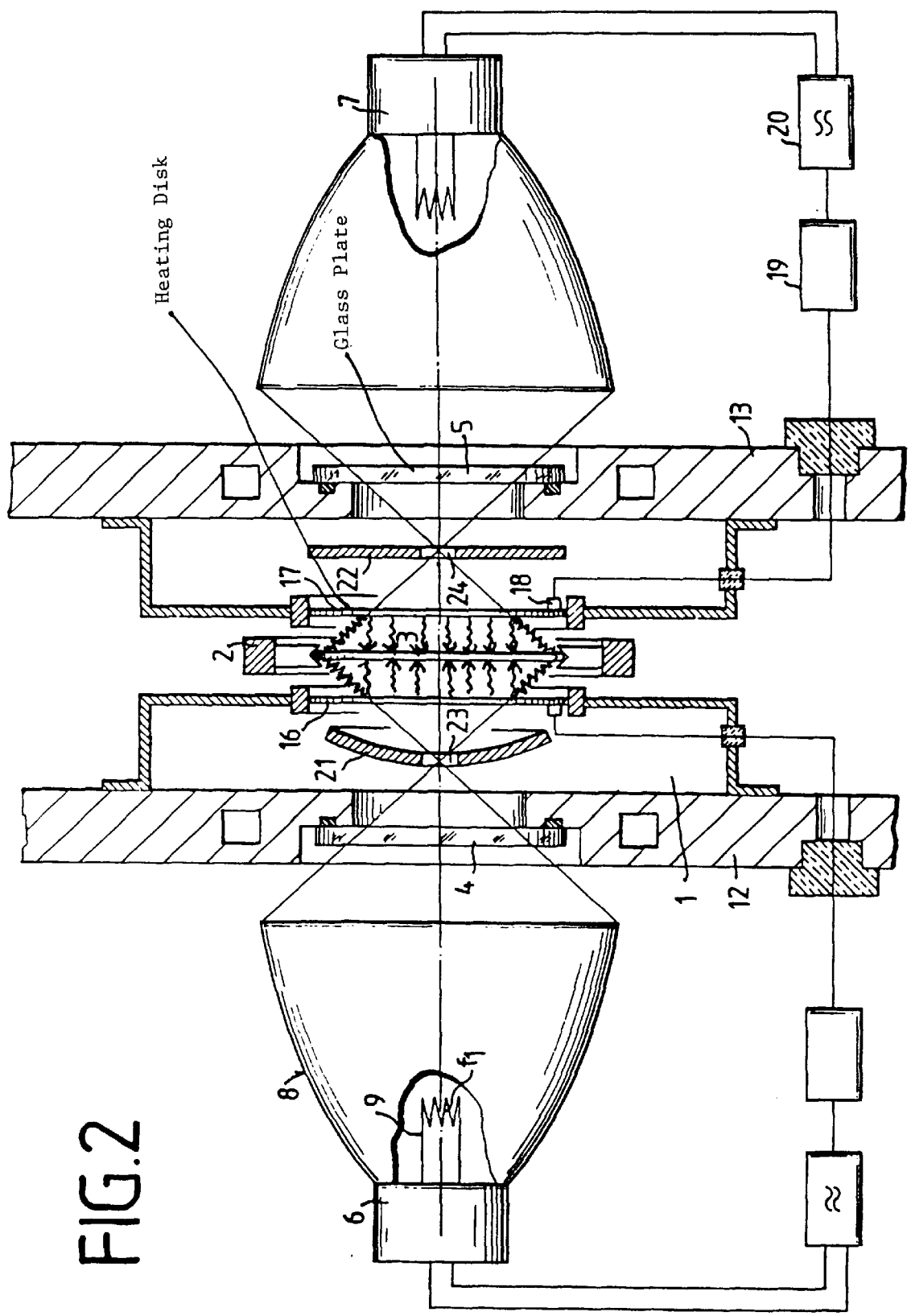
FIG. 2 is a section corresponding to FIG. 1 through a modified embodiment.

In the embodiment according to FIG. 2, a temperature sensor 18 is disposed externally on each of the heating disks and is connected with a controller 19 which in turn controls the power supply 20 of each lamp 6 and 7 and thus keeps the temperature of each particular heating disk 16 and 17 stable.

Also, FIG. 2 shows that between the glass disk 4 and the heating disk 16 a reflector 21 is disposed, and accordingly between the glass disk 5 and the heating disk 17 a reflector 22 is disposed. These reflectors can be curved, as reflector 21, or planar, as reflector 22. It is important that the reflectors 21, 22, have respective openings 23, 24, for the radiation of the lamps 6, 7. Since the reflectors are disposed each at the focal point of the lamp 6, 7, the openings 23, 24, can be small.

We claim:

1. Apparatus for heating a substrate in a vacuum chamber, said apparatus comprising a vacuum chamber having wall means with glass plate means therein, substrate holding means inside the vacuum chamber, lamp means outside said vacuum chamber, said lamp means emitting radiation in a first wavelength range which passes through said glass plate means toward said substrate holding means, and heating disk means between said glass plate means and said substrate holding means, said heating disk means having a high absorption of radiation in a said first wavelength range and a high emission of radiation in a second wavelength range above said fist wavelength range.

2. Apparatus as in claim 1 wherein said heating disk means consists of Inconel.

3. Apparatus as in claim 1 wherein said heating disk means consists of graphite.

4. Apparatus as in claim 1 said lamp means comprises means for focusing said radiation at a focal point inside said vacuum chamber.

5. Apparatus as in claim 1 wherein said lamp means comprises an elliptical reflector having a first focal point and a second focal point, and a radiation emitting filament at said first focal point.

6. Apparatus as in claim 5 wherein said second focal point is inside said vacuum chamber.

7. Apparatus as in claim 1 wherein said glass plate means comprises glass plates on opposite sides of said substrate holder, said lamp means comprises lamps on opposite sides of said vacuum chamber, and said heating disk means comprises heating disks on opposite sides of said substrate holding means.

8. Apparatus as in claim 1 further comprising temperature sensor means disposed on said heating disk means and generating signals corresponding to temperature sensed, power supply means for supplying power to said lamp means, and controller means for controlling said power to said lamp means based on said signals from said temperature sensor means.

9. Apparatus as in claim 1 further comprising reflector means disposed between said glass plate means and said heating disk means, said reflector means having central aperture means for admitting radiation from said lamp means.

10. Apparatus as in claim 1 wherein said lamp means comprises a lamp which emits radiation having a maximum wavelength of 1.1 to 1.4 $\mu$m.

11. Apparatus as in claim 10 wherein said lamp has a tungsten filament.

12. Apparatus as in claim 1 wherein said heating disk emits radiation having a wavelength above 2.5 $\mu$m.

13. Apparatus for heating a substrate, comprising a vacuum chamber having wall means with glass plate means therein, substrate holding means inside the vacuum chamber, lamp means outside said vacuum chamber, said lamp means comprising means for emitting radiation through said glass plate means and focusing said radiation at a focal point inside said vacuum chamber, said focal point being between said glass plate means and said substrate holding means, and reflector means disposed between said glass plate means and said substrate holding means, said reflector means having central aperture means for admitting radiation from said lamp means.

14. Apparatus as in claim 13 wherein said lamp means comprises a hot filament and an elliptical reflector having a first focal and a second focal point, said hot filament being located at said first focal point, said second focal point constituting said focal point between said glass plate means and said substrate holding means.

15. Apparatus as in claim 13 wherein said focal point is located in said central aperture means.

* * * * *